US005798584A

United States Patent [19]

Schaeffeler et al.

[11] Patent Number: 5,798,584

[45] Date of Patent: Aug. 25, 1998

[54] ELECTRIC SWITCH, ESPECIALLY FOR ELECTRIC HAND TOOLS

[75] Inventors: Alois Schaeffeler, Spaichingen; August Geiger, Talheim; Jens Mueller, Tuttlingen, all of Germany

[73] Assignee: Marquardt GmbH, Rietheim-Weilheim, Germany

[21] Appl. No.: 614,204

[22] Filed: Mar. 12, 1996

[30] Foreign Application Priority Data

Mar. 13, 1995 [DE] Germany ........................ 195 08 925.1

[51] Int. Cl.$^6$ ................................ H05K 7/20; H05K 5/00

[52] U.S. Cl. ................................................ 310/50; 310/64

[58] Field of Search ................................ 310/50, 47, 46, 310/64

[56] References Cited

U.S. PATENT DOCUMENTS 4,137,490 1/1979 Brozoski et al. .

FOREIGN PATENT DOCUMENTS

| | | |
|---|---|---|
| 0 489 343 | 6/1992 | European Pat. Off. . |
| 0 512 316 | 11/1992 | European Pat. Off. . |
| 2 613 270 | 9/1994 | France . |
| 80 24 180 | 12/1980 | Germany . |
| 8412947 U | 7/1984 | Germany . |
| 33 08 328 | 9/1984 | Germany . |
| 8505814 U | 5/1985 | Germany . |
| 34 33 552 | 3/1986 | Germany . |
| 3601 130 | 8/1986 | Germany . |
| 41 14 854 | 11/1992 | Germany . |
| 38 42 588 | 12/1992 | Germany . |
| 40 38 785 | 9/1993 | Germany . |
| 40 38 787 | 9/1993 | Germany . |
| 40 16 663 | 7/1994 | Germany . |
| 39 01 728 | 10/1994 | Germany . |
| 43 17 002 | 11/1994 | Germany . |

*Primary Examiner*—Steven L. Stephan
*Assistant Examiner*—Judson H. Jones
*Attorney, Agent, or Firm*—Spencer & Frank

[57] ABSTRACT

The invention relates to an electric switch (1), especially for use for an electric hand tool having an electric motor, such as a battery-operated electric tool having a direct-current motor. The switch (1) possesses a housing (2) for receiving a contact system, a movable actuating member which acts on at least one switch contact of the contact system, and control electronics (26) located in the housing (2) as well as an associated power semiconductor (28) for varying the rotational speed of the electric motor. The power semiconductor (28) is connected via a current-bearing and heat-conducting carrier part (31) to the contact system located in the housing (2) and, further, is heat-conductively connected to a cooling body (34) located on the outside of the housing (2). The carrier part (31) extends through a wall perforation (33) of the housing (2) at least as far as the cooling body (34). To simplify assembly, the cooling body (34) is held directly on the carrier part (31) non-positively and/or positively without additional fastening means.

26 Claims, 6 Drawing Sheets

ELECTRIC SWITCH, ESPECIALLY FOR ELECTRIC HAND TOOLS

The invention relates to an electric switch having a housing, a contact assembly supported in the housing; a movable actuating member for switching the contact assembly; control electronics, including a power semiconductor, supported in the housing for controlling a motor of the electric hand tool, a cooling body disposed externally of the housing, and a heat-conducting and electrically conducting carrier part supported in the housing and being electrically and heat-conductingly connected to the power semiconductor. The carrier part is in a heat-transferring contact with the cooling body.

In electric hand tools, an electric switch accommodated in the handle serves for manual actuation by the user, whilst electronic components for activating further functions, such as rotational speed control or rotational speed regulation, can be accommodated in the housing of the switch. Particularly in battery-operated electric tools, on account of the high flowing currents it is necessary to ensure that the heat generated in the switch is reliably dissipated outwards.

German Offenlegungschrift 4,114,854 disclosed an electric switch of this type which is intended especially for use in a battery-operated electric tool having a direct-current motor. The switch possesses a housing for receiving two contact systems, a movable actuating member which acts on the switch contact of the two contact systems, and control electronics located in the housing, as well as an associated power transistor for varying the rotational speed of the electric motor. To discharge the lost heat, the power transistor arranged in a wall perforation of the housing is heat-conductively connected via a cooling tab to a cooling body located on the outside of the housing and covering the wall perforation. Located inside the housing is a bearing plate which serves for receiving further electric components, such as one of the contact systems. A current-bearing carrier part designed as a connecting bolt leads, in turn, from this bearing plate to the power transistor. The cooling body is fastened to the connecting bolt by means of a screw passing through the cooling tab on the power transistor, so that the carrier part serves at the same time for discharging heat from inside the housing onto the cooling body.

The connecting bolt requires an internal thread for receiving the screw for the cooling body. It has emerged as a disadvantage that the connecting bolt is a part which is complicated to manufacture and which, moreover, has to be soldered or welded to the bearing plate. A further additional operation is necessary, during assembly, for the screwing of the cooling body. The assembly of the known switch is therefore complicated and consequently expensive.

Another disadvantage is that, when the cooling body is being assembled, there is no guarantee that the cooling tab of the power transistor will bear on the cooling body. In this case, there may be poor heat transmission between the power transistor and the cooling body, so that the lost heat of the power transistor is dissipated incompletely. Consequently, the switch may be destroyed as a result of inadmissible heating.

In this switch, although the wall perforation is closed relative to the outside by means of the screwed-on cooling body, nevertheless, since electric hand tools are often operated under extreme conditions of use, the possibility can not be ruled out that dust and dirt will infiltrate inside the housing between the cooling body and the housing wall at the wall perforation, especially when the screw loosens as a result of vibrations of the electric hand tool. There is therefore the risk of premature failure of the switch.

The object on which the invention is based is to design an electric switch of this type in such a way that assembly is simplified and improved. Furthermore, protection against the infiltration of dirt and dust into the housing is to be improved.

This object and other to become apparent as the specification progresses, are accomplished by the invention, according to which, briefly stated, the electric switch includes a housing defined by housing walls; a contact assembly supported in the housing; a movable actuating member for switching the contact assembly; control electronics, including a power semiconductor, supported in the housing for controlling a motor of the electric hand tool; and a cooling body disposed externally of the housing. The cooling body has a throughgoing orifice in alignment with a throughgoing aperture provided in a housing wall. A heat-conducting and electrically conducting carrier part supported in the housing and being electrically and heat-conductingly connected to the power semiconductor. The carrier part extends through the throughgoing aperture of the housing wall and the throughgoing orifice of the cooling body. The carrier part is oriented substantially perpendicularly to the cooling body and is in a heat-transferring contact therewith. A fastening device is provided for holding the cooling body against the housing wall.

The advantages afforded by the invention, are, in particular, that a simplification of production and a simplification and automatability of the assembly of the switch are achieved. Thus, the cooling body, when being assembled on the housing, is merely attached to the carrier part, where it is held non-positively and/or positively. Additional fastening means on the carrier part are not necessary, with the result that an expensive and labor-intensive screw connection of the cooling body on the housing can be saved. Simultaneously with the assembly of the cooling body, the power semiconductor is positioned in such a way that optimum heat transmission to the cooling body is guaranteed. The invention thus achieves an improvement and a reduction in price of the switch.

In a development of the invention, the carrier part is designed as a current-bearing and heat-conducting connecting web extending integrally from a bearing part located inside the switch and on which the switch contact of a contact system is articulated. A carrier part of this type is simple and cost-effective to produce as a stamping. The connecting web passes through the cooling tab on the power semiconductor as well as an orifice in the cooling body. The connecting web can be designed conically at its end facing the cooling body, so that, during assembly, the cooling body is merely pressed by means of its orifice on to the connecting web. The cooling body is consequently held non-positively on the connecting web. The conical end of the connecting web at the same time affords a kind of tolerance compensation, so that, during assembly, the cooling tab of the power semiconductor always comes to bear properly on the cooling body for the creation of good heat transmission. It is also possible to rotate that part of the connecting web passing through the orifice of the cooling body, so that a kind of positive connection as a result of the offset between the connecting web and the cooling body is achieved. It is further possible to caulk or emboss the connecting web in the orifice of the cooling body so as to make a positive connection.

According to further embodiments of the invention which are the subject of the subclaims, the switch can be reliably protected in an effective way against the infiltration of dust and dirt, even when it is used under extreme conditions. The edge of the wall perforation is provided with an essentially rigid sealing edge running all-round and integrally connected to the housing, or with just such a flexible sealing lip. The cooling body, by virtue of retention on the carrier part, bears, in turn, on this sealing edge or this sealing lip with some pressure force. Consequently, the lifetime of the switch is lengthened and its operating reliability increased.

The sealing edge or sealing lip can be jointly injection-molded on by the injection-molding method in a simple way in one operation during the production of the housing of the switch, preferably the same thermoplastic material being used for the sealing edge or the sealing lip as for the housing. To achieve the elasticity of the sealing lip, with which the latter bears on the cooling body, said sealing lip has a smaller thickness than the housing wall and can be designed as an approximately U-shaped resilient extension.

In comparison with the known switch, a further reduction in price can be achieved by a simplification of individual components of the switch, whilst ensuring the same or even further improved functionality. Thus, connecting clips for a battery can be arranged on the switch underside, the connecting clips being produced from a single stamping by appropriate bending. This avoids the need for complicated welded joints. Finally, in the case of a changeover switch integrated in the switch for the direction of rotation of the electric motor, the actuating lever for the changeover can be provided with a hook element which engages into a slotted catching and pressure-point piece. Both the hook element and the slotted piece can consist of plastic and be produced by the injection-molding method, thus saving expensive spring elements made of metal.

A further simplification in the assembly of the switch can be achieved by arranging fixing and/or catching elements which are located on the outside of the housing, above all in the vicinity of the sealing edge or sealing lip, and on to which the cooling body is snapped. The cooling body can consist of copper, aluminum or the like and be structured on its surface.

Exemplary embodiments of the invention are represented in the drawings and are described in more detail below.

Figure 1:
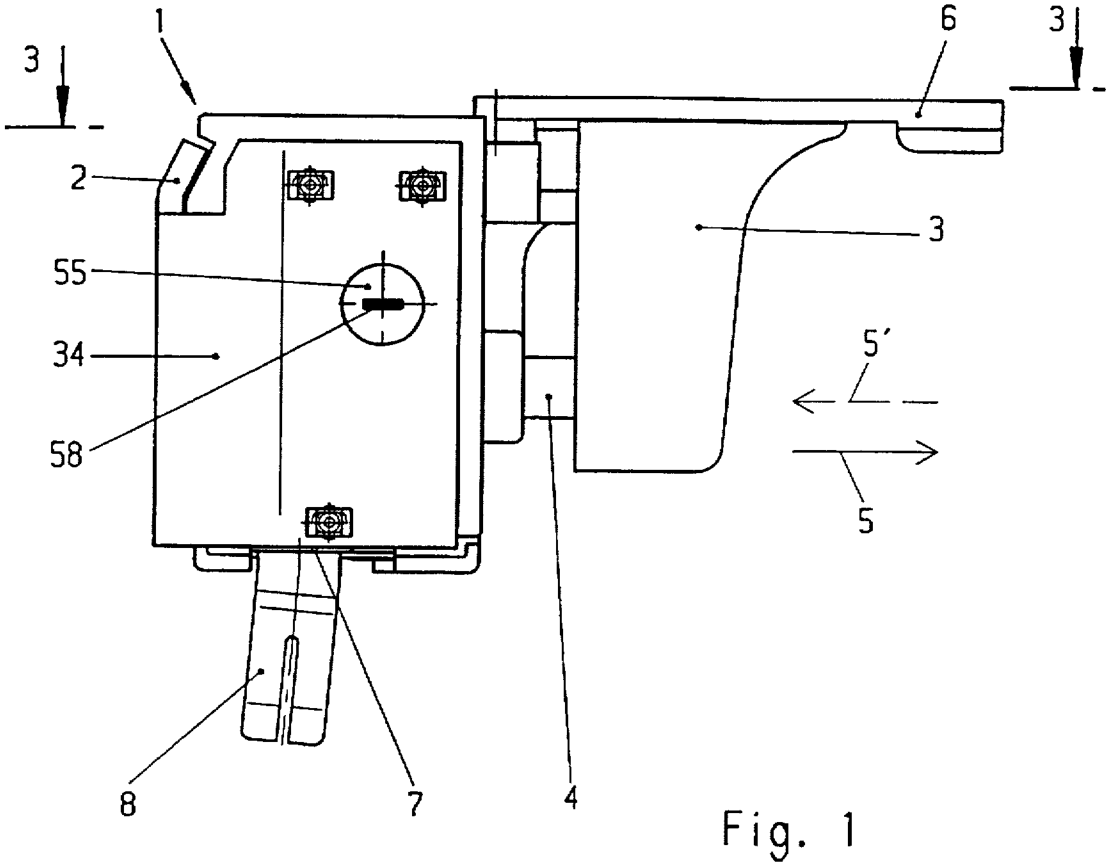
FIG. 1 shows a side view of an electric switch for an electric hand tool.

An electric switch 1 for regulating the rotational speed of electric motors, which is used especially in electric hand tools having an electric motor, specifically, above all, in battery-operated electric tools with a direct-current motor, such as, for example, drilling machines, electric screw drivers or the like, is represented diagrammatically in FIG. 1. The switch 1 possesses a housing 2 which consists of a thermoplastic, especially a glass fiber reinforced polyamide. Arranged on the housing 2 is a movable actuating member 3 designed as a trigger and having an actuating tappet 4 fastened thereto and leading into the interior of the switch 1. The actuating member 3 can be moved manually in the direction of the arrow 5 counter to a compression spring 53 shown in FIG. 3, so that, after release, it returns into the initial position again, according to the arrow 5'. By means of the actuating member 3, the electric hand tool is switched on and the rotational speed of the electric motor is regulated according to the position of the actuating member 3.

Figure 3:
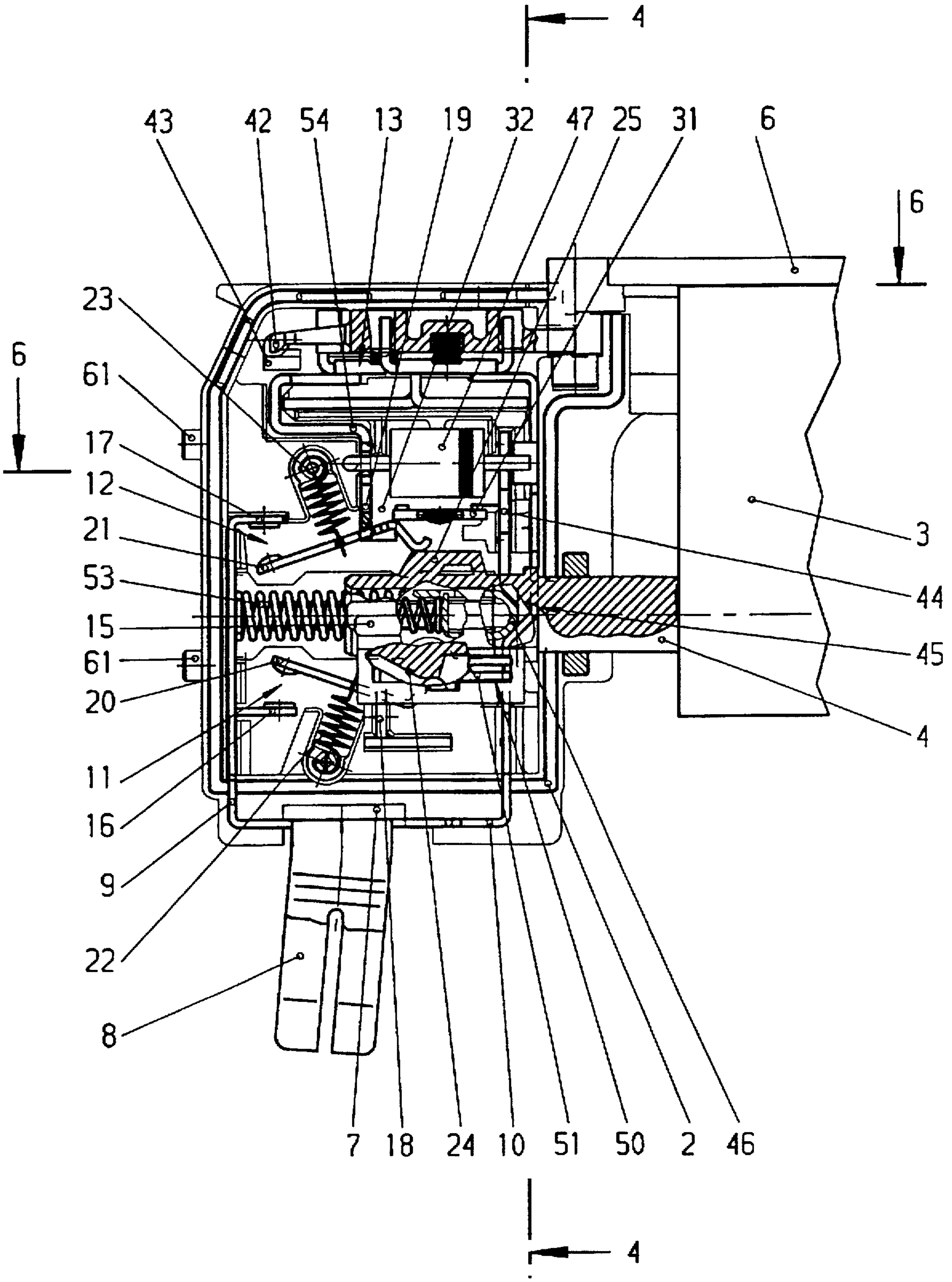
FIG. 3 shows a longitudinal section along the line 3—3 from FIG. 1.

Furthermore a changeover switch for the direction of rotation of the electric motor, having a contact system 13 which can be seen in FIG. 3, is integrated in the housing 2 of the switch 1, the contact system 13 being designed as a pole-reversing switch for the electric motor and being actuable via an actuating lever 6. The actuating lever 6 is movable into two switching positions, namely into a first for the right-handed rotation and into a second for the left-handed rotation of the electric motor, according to the particular switching position of the actuating lever 6, the circuit to the electric motor being switched in such a way that the electric motor rotates to the right or to the left. Arranged on the actuating lever 6, inside the housing 2, is a hook element 42 which is designed integrally with the actuating lever 6 and which engages into a corresponding slotted piece 43 to produce a pressure point during the changeover and a catch in the respective switching positions. Both the hook element 42 and the slotted piece 43 consist of plastic.

Figure 2:
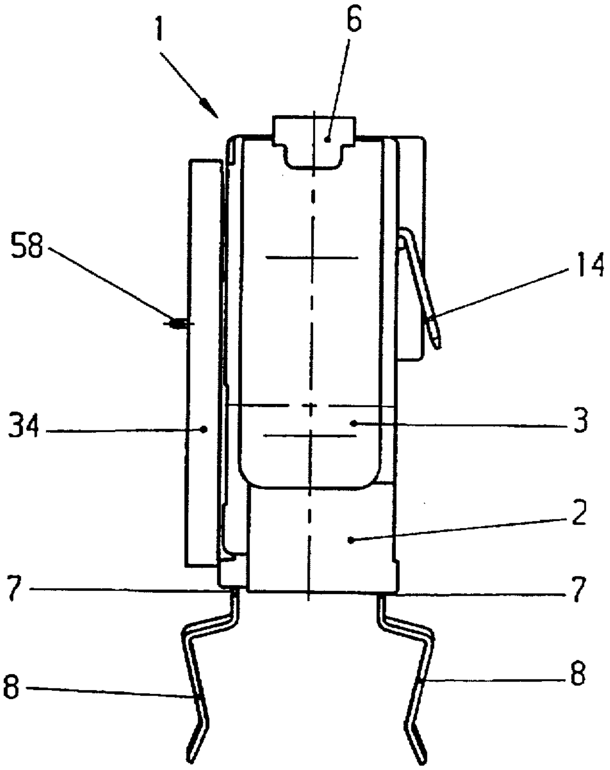
FIG. 2 shows a front view of the electric switch in the direction of the arrow 5 from FIG. 1

Located on the underside of the housing 2 are two connections 7 for the current supply which lead into the switch 1. The connections 7 are provided on the outside of the housing 2 with connecting clips 8, as can be seen especially from FIG. 2. The battery is attached to the connecting clips 8. The connecting clips 8 are connected integrally to the connections 7, in that the connections 7 together with the connecting clips 8 are designed as an appropriately bent stamping.

As can be seen in more detail in FIG. 3, inside the housing 2 a contact bar 9 extends integrally from the first connection 7 and leads to two contact systems 11, 12 which are located in the housing 2 and on which the actuating member 3 acts by means of a cam control. For this cam control, cams 24, 25 are located on an extension 15 of the actuating tappet 4, the cam 24 being actually concealed in FIG. 3 and therefore being shown partially cut away. The contact system 12 is arranged on a bearing plate 32, from which a contact track 54 in turn runs to a contact of the contact system 13 of the changeover switch for the direction of rotation of the electric motor. A further contact bar 10 extends from the second connection 7 and leads through the housing 2 to the other contact of the contact system 13. Finally, on this changeover switch, further connections 14 are then located on the top side of the housing 2 for connection to feed lines for the electric motor, as shown once again in FIG. 2.

As shown further in FIG. 3, the contact bar 10 is designed in such a way that this and a contact arm 44 fastened to the bearing plate 32 form a contact point 45 for a contact bridge 46 arranged on the actuating tappet 4. When the actuating member 3 is in the non-actuated position shown in FIG. 3, the contact bridge 46 short-circuits the electric motor via the contact point 45 and thus brings about a braking of the electric motor.

The contact systems 11, 12 each consist of a fixed contact 16, 17 connected to the contact bar 9 and of a switch contact 20, 21 which is rotatable in a knife-edge bearing 18, 19 and which is loaded with a force in the closing direction by means of a tension spring 22, 23. With the actuating member 3 non-actuated, the switch contacts 20, 21 are held in a positively opened position by the cams 24, 25 on the extension 15 of the actuating tappet 4, in that the cam 24, 25 acts on one end of the switch contact 20, 21 with the result that the contact connection between the other end of the switch contact 20, 21 and the fixed contact 16, 17 is opened. When the actuating member 3 is moved in the direction of the arrow 5 according to FIG. 1, the position of the actuating member 3, in which the contact system 11, 12 closes or opens, is determined via the geometry of the respective cam 24, 25. In a specific actuating position of the actuating member 3, the cam 24, 25 releases one end of the switch contact 20, 21, with the result that the tension spring 22, 23 pulls the other end of the switch contact 20, 21 on to the fixed contact 16, 17, so that the electric connection is then closed.

Figure 4:
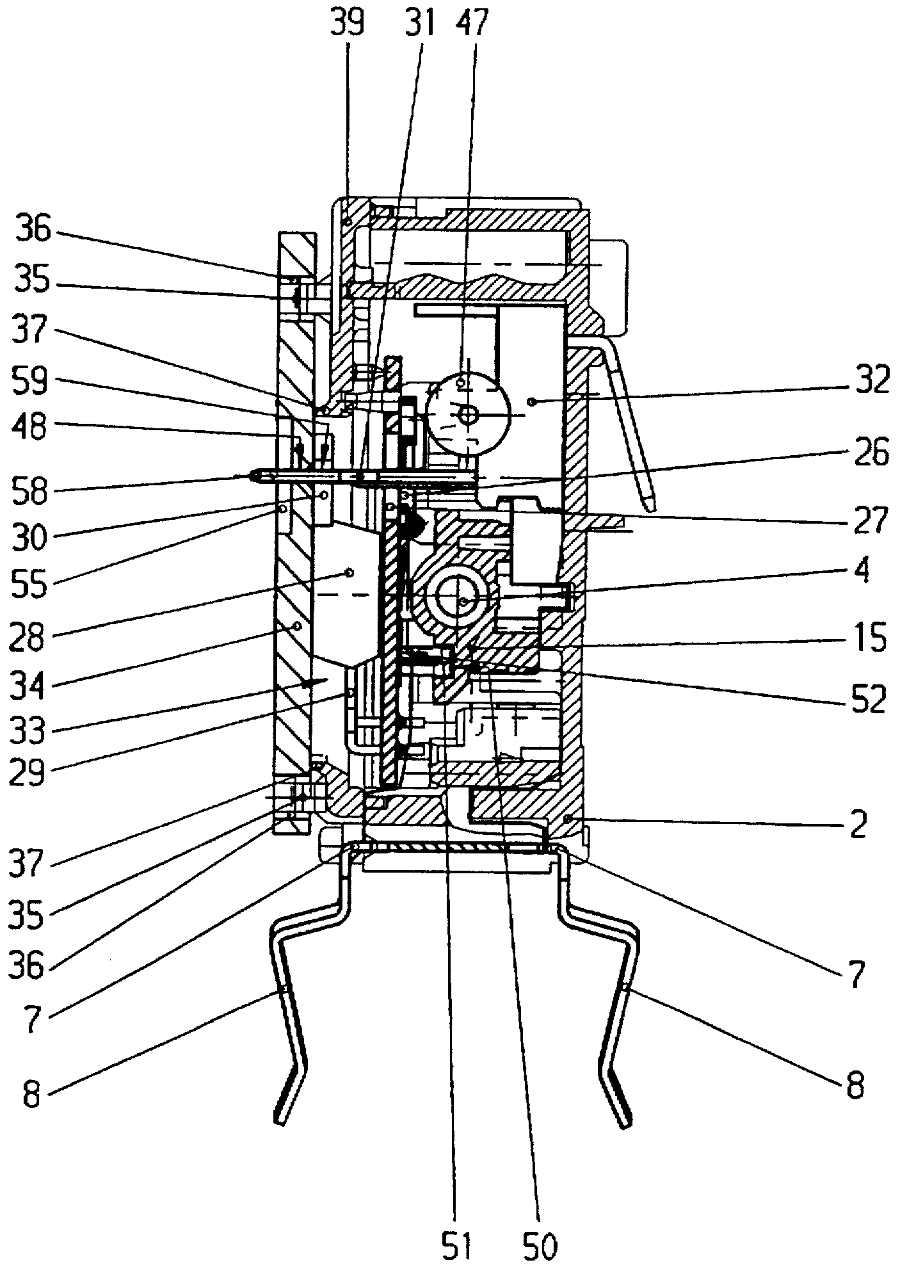
FIG. 4 shows a longitudinal section along the line 4—4 from FIG. 3.

By means of an appropriate design of the cams 24, 25, in the event of a movement of the actuating member 3 in the direction of the arrow 5 according to FIG. 1, the contact system 11 switches first, with the consequence that the voltage supply from the battery is switched on for control electronics 26 located in the housing 2 and an associated power semiconductor 28 for the purpose of varying the rotational speed of the electric motor. As can be seen in FIG. 4, the control electronics 26 are arranged on a circuit board 27. To regulate the rotational speed, inside the housing 2 a wiper 51 is located in a receptacle 50 on the extension 15 of the actuating tappet 4. This wiper 51 slides with one end on a resistance track 52 located on the circuit board 27, the wiper 51 and the resistance track 52 thereby forming a potentiometer. As a result of the movement of the actuating member 3, the wiper 51 is moved linearly on the resistance track 52 and consequently varies the position of the potentiometer. The electrical resistance, which corresponds to the respective position of the potentiometer and which is therefore correlated to the respective position of the actuating member 3, serves as a desired value for the setting and regulation of the rotational speed of the electric motor by means of the control electronics 26 located on the circuit board 27. The electric motor is activated according to this desired value by the control electronics 26 by pulse-width modulation via the power semiconductor 28. A power transistor, for example a MOSFET, can be used as a power semiconductor 28. Circuit arrangements for control electronics 26 of this kind are known, so that there is no need to go into these in more detail.

The power semiconductor 28 is likewise arranged with its connections 29 on the circuit board 27 and possesses a cooling tab 30 which, as a further connection of the power semiconductor 28 for the motor current to be controlled, is connected electrically conductively to the bearing plate 32 via a carrier part 31 designed as a connecting web. As already mentioned, the contact track 54 shown in FIG. 3 leads from the bearing plate 32 further to the contact system 13 of the changeover switch for the direction of rotation of the electric motor. A recovery diode 47 is articulated or fastened between the bearing plate 32 and the contact bar 10 for the protection of the control electronics 26. With the actuating member 3 pressed in completely, the contact system 12 arranged on the bearing plate 32 is switched by the cam 25, so that the control electronics 26 are bridged via the contact system 12 and the maximum motor current for full load flows directly from the contact bar 9 via the contact system 12 and the contact track 54 to the contact system 13 of the changeover switch for the direction of rotation.

Figure 7:
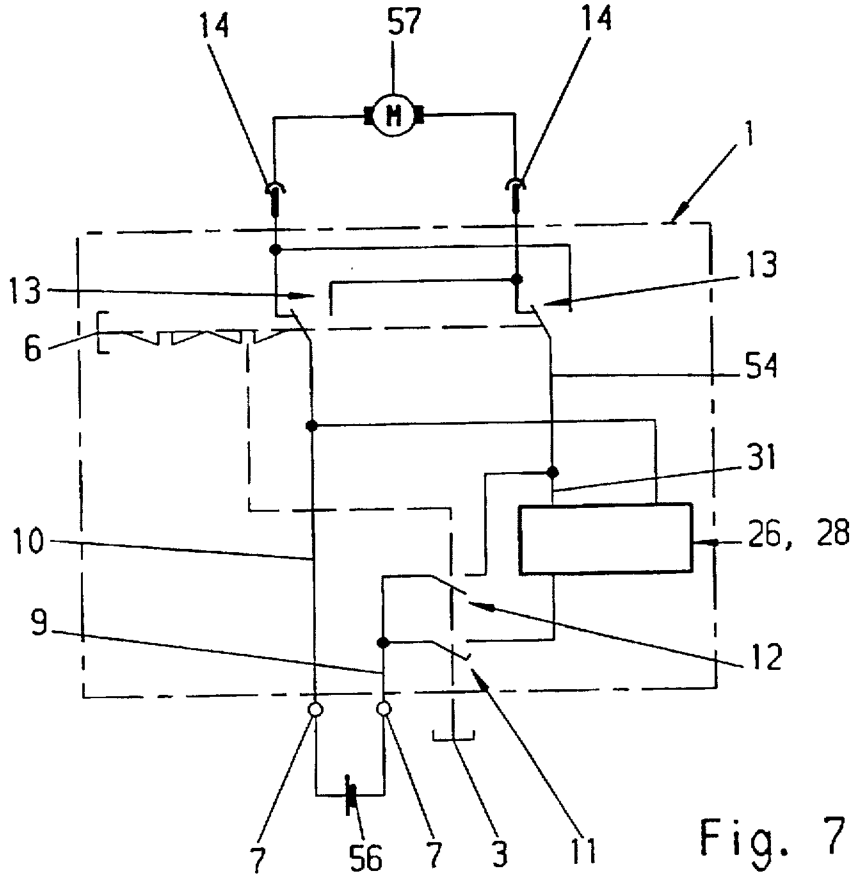
FIG. 7 shows diagrammatically a circuit arrangement for the electric switch

For the sake of greater clarity, the circuit arrangement described for the electric switch 1 is reproduced diagrammatically in FIG. 7. A battery 56 is connected to the connections 7 of the switch 1. The battery 56 serves as an energy source for an electric motor 57 which is connected in turn to the connections 14 of the switch 1. As already described, via the switch 1, the electric motor 57 is activated according to the position of the actuating member 3 and of the actuating lever 6.

So that the heat generated in the power semiconductor 28 during operation can be dissipated into the environment, the power semiconductor 28 is arranged on a rectangular wall perforation 33 in a housing wall 39 of the housing 2, as can be seen especially from FIG. 4. The wall perforation 33 is covered with a cooling body 34 which is located on the outside of the switch housing 2 and which bears in a dust-tight manner by means of some pressure force on an essentially rigid sealing edge 37 which, as can be taken from FIG. 5, runs all-round the wall perforation 33. The sealing edge 37 consists of the same material as the housing 2 and is injection-molded integrally on to the housing 2. Furthermore, the cooling body 34, by bearing on the cooling tab 30, is heat-conductively connected to the power semiconductor 28. To dissipate heat from inside the housing 2, for example the heat generated in the recovery diode 47 and in the contact system 12, the bearing plate 32 is connected to the cooling body 34 via the current-bearing and heat-conducting carrier part 31 which passes through the cooling tab 30 of the power semiconductor 28 at an orifice 59.

According to FIG. 4, the carrier part 31 is integrally bent as a connecting web from the bearing plate 32 designed as a stamping and is therefore fastened to the bearing plate 32 inside the housing 2. The cooling body 34 consisting of metal, for example copper, aluminum or the like, is held on the outside of the housing 2 by the carrier part 31. For this purpose, the carrier part 31 is designed in such a way that it projects from inside the housing 2 through the wall perforation 33 and reaches at least as far as the cooling body 34, where the cooling body 34 is then arranged directly on the carrier part 31 non-positively and/or positively. Thus, the cooling body 34 is held captive on the carrier part 31 without additional fastening means, in particular, therefore, without screws, rivets or the like, good heat transmission being ensured by some pressure force both on the carrier part 31 and on the cooling tab 30. For an additional improvement in the heat transmission from the cooling body 34 to the environment, its surface can also be structured in order to enlarge the heat transmission area, for example by working in elevations and depressions.

Figure 6:
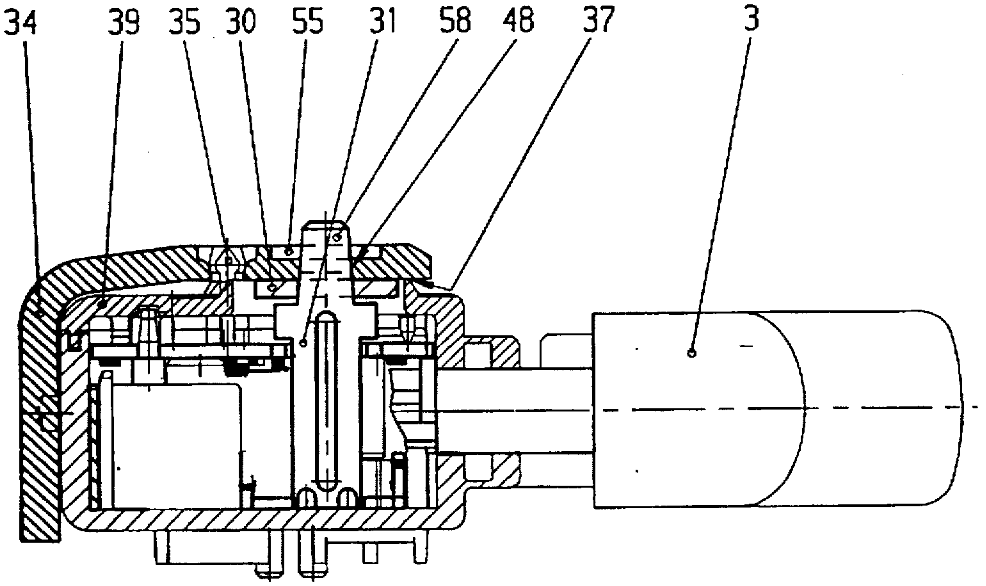
FIG. 6 shows a section along the line 6—6 from FIG. 3.

The carrier part 31 is arranged, in the present case, approximately perpendicularly to the cooling body 34 and reaches somewhat beyond the cooling body 34, that part 58 of the carrier part 31 assigned to the outside of the housing 2 passing through the cooling body 34 at an orifice 48. In a first embodiment, for the assembling of the cooling body 34, that part 58 of the carrier part 31 which is located in the region of the cooling body 34 is made conical, as can be seen especially in FIG. 6. During assembly, the cooling body 34 is pressed by means of its orifice 48 on to the carrier part 31 at the conical part 58, until the cooling body 34 bears on the sealing edge 37. At the same time, a non-positive connection is made between the cooling body 34 and the carrier part 31. The assembly of the cooling body 34 can expediently take place in such a way that the conical side flanks of the part 58 cut into the material of the cooling body 34 surrounding the orifice 48, thereby further increasing the non-positive connection. Simultaneously, when the cooling body 34 is pressed on to the carrier part 31, the cooling body 34 comes into contact with the cooling tab 30 of the power semiconductor 28. The power semiconductor 28 is at the same time pressed into its end position by means of the cooling body 34, so that a firm and flat bearing of the cooling tab 30 on the cooling body 34 and therefore good heat transmission are guaranteed. By pressing the cooling body 34 on until it bears on the sealing edge 37, production tolerances are advantageously compensated by the conical part 58 while the non-positive connection between the carrier part 31 and the cooling body 34 is being made, so that a reliable dust-tightness of the switch 1 is also always guaranteed.

Figure 8:
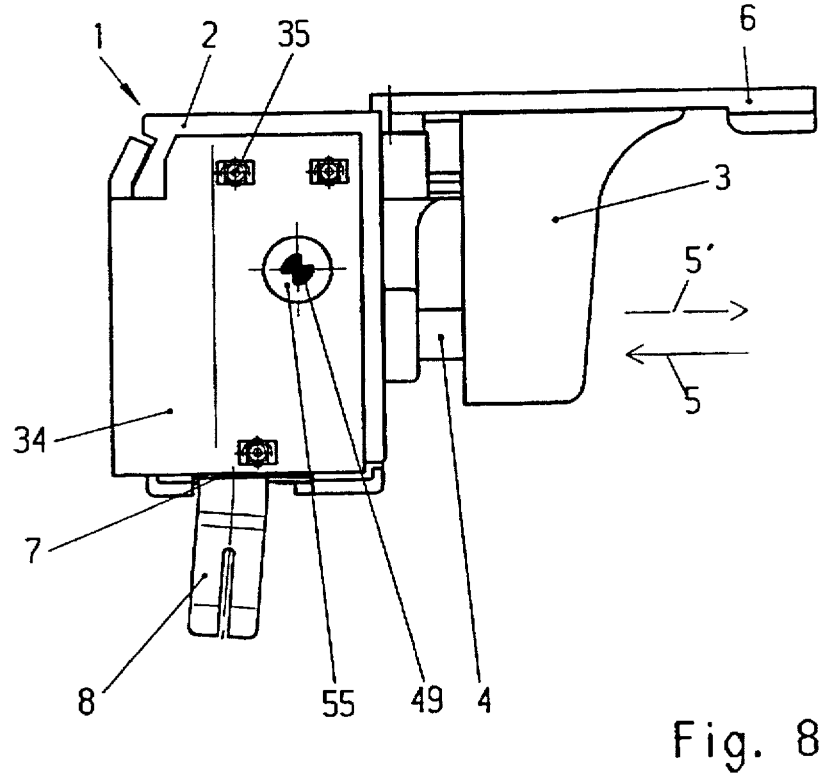
FIG. 8 shows an electric switch, as in FIG. 1, in a further embodiment and, FIG. 9 shows a section, as in FIG. 6, in yet a further embodiment.

In a further embodiment, the part 58 on the carrier part 31 is made essentially rectangular. The cooling body 34 is placed with the orifice 48 on to the carrier part 31, the part 58 projecting. The orifice 48 is expediently surrounded by a depression 55 in the cooling body 34 on the outer surface of the latter. The projecting part 58 of the carrier part 31 is subsequently provided with an offset 49 in the depression 55 by twisting or the like, as can be seen in FIG. 8. The cooling body 34 is thereby held on the carrier part 31 by means of a kind of positive connection. Further possibilities for retaining the cooling body 34 on the carrier part 31 also, of course, come under consideration. Thus, the cooling body 34 can also be calked or embossed on the carrier part 31.

The assembly of the cooling body 34 on the outside of the housing 2 by means of a non-positive and/or positive arrangement on the carrier part 31 can be further made easier if fixing and/or catching elements are arranged on the outside of the housing 2. Catching elements designed as catch hooks 35 are shown in FIG. 4 and catch in the manner of snap connections in recesses 36 on the cooling body 34 during the assembly of the latter. Further fixing elements, which are designed as nipples 61, knobs, studs or the like and on to which the cooling body 34 is pushed during assembly for the purpose of adjustment and fixing on the housing 2 by means of grooves, not shown further, in the cooling body 34, can be seen in FIG. 3. The cooling body 34 is additionally held on the housing 2 by means of these fixing or catching elements.

Figure 9:
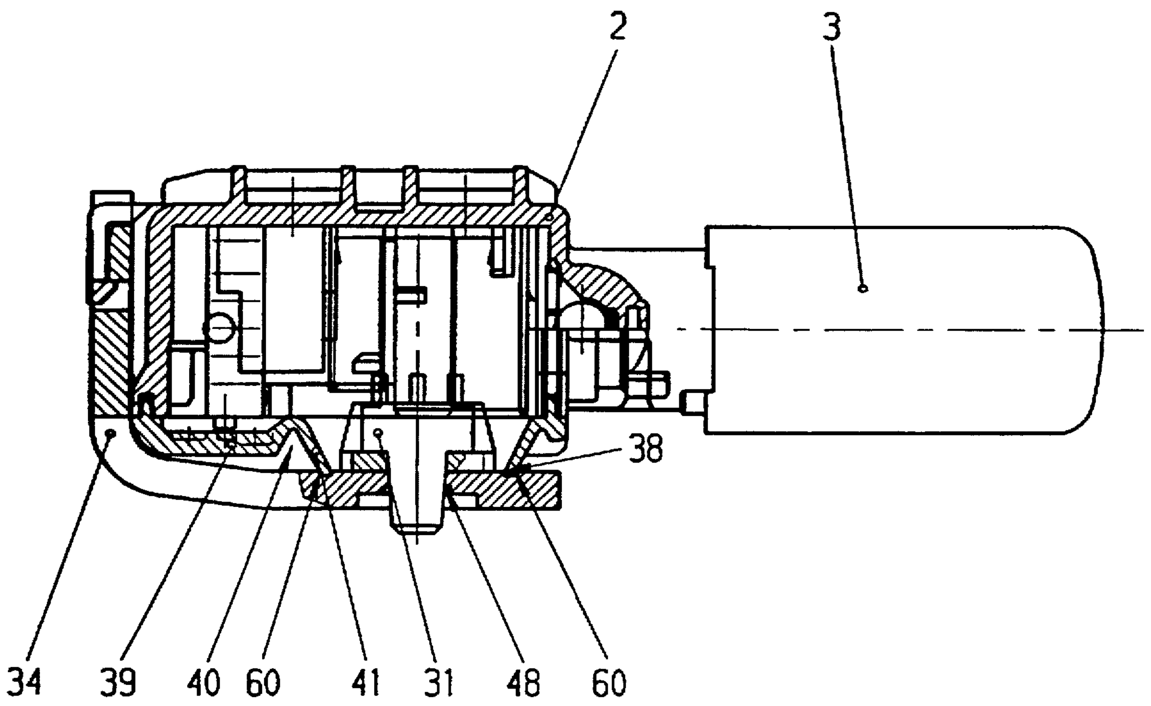

Dirt and dust are effectively prevented from infiltrating into the housing 2 of the switch 1, in that the cooling body 34 bears with some pressure force on the sealing edge 37 and consequently seals off the wall perforation 33. A further improvement can also be achieved, where appropriate, by designing the sealing edge as a sealing lip 60, as shown in FIG. 9. The sealing lip 60 is directed to the outside of the housing 2. That end of the sealing lip 60 assigned to the outside of the housing 2 is connected non-positively to the cooling body 34, in that the sealing lip 60 bears elastically on the cooling body. Alternatively or even additionally to the non-positive connection, the sealing lip 60 can also be connected positively to the cooling body 34. For this purpose, that end of the sealing lip 60 assigned to the outside of the housing 2 engages, for example, into a corresponding groove 38 running all-round on the cooling body 34.

The sealing lip 60 can consist of the same thermoplastic as the housing wall 39 and be integrally connected to the housing 2. The sealing lip 60 can be produced particularly simply if it is jointly injection-molded on in one operation during the production of the housing wall 39. To achieve the necessary elasticity, the sealing lip 60 is designed with a thickness smaller than that of the housing wall 39. For this purpose, the sealing lip 60 is designed as an elastic resilient extension 41 which is approximately U-shaped with a depression 40 relative to the housing wall 39. The extension 41 projects at an angle from the surface of the housing wall 39, and this angle can be approximately 50 to 90 degrees.

Figure 5:
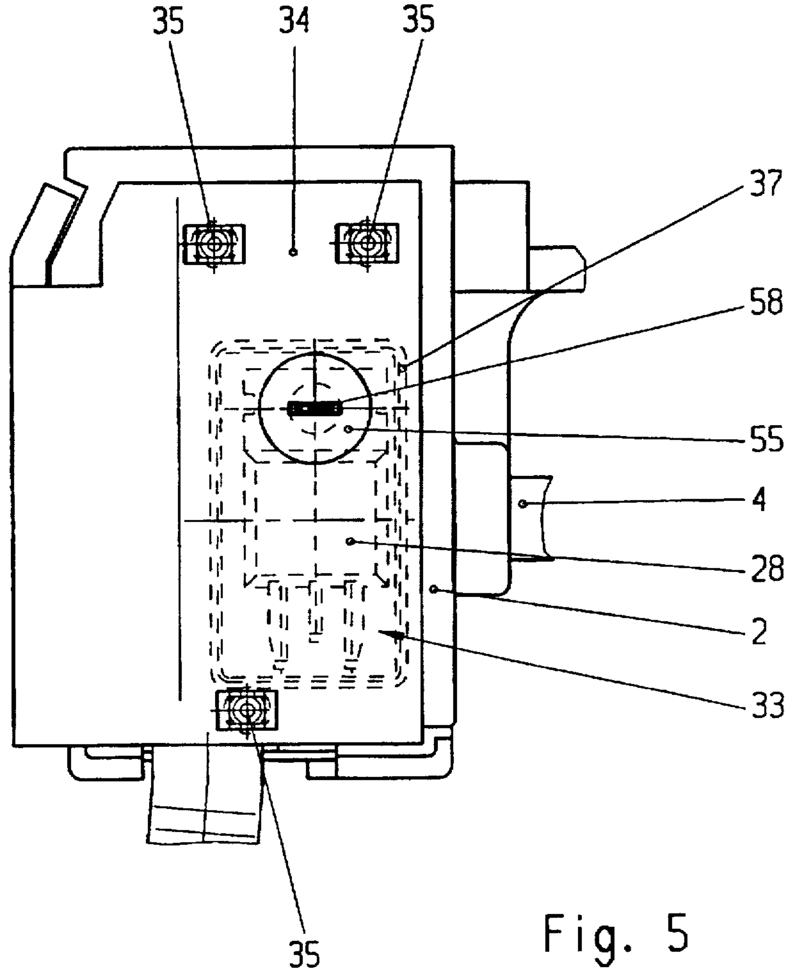
FIG. 5 shows a side view, as in FIG. 1, the wall perforation, which cannot be seen per se, being marked by broken lines.

By virtue of the non-positive and/or positive direct connection between carrier part 31 and cooling body 34, the cooling body 34 bears with some pressure force on the sealing edge 37 or the sealing lip 60, in such a way that reliable sealing off is achieved. The pressure force can also be increased by the snap effect of the catch hooks 35 on the cooling body 34, especially when the catch hooks 35, nipples 61 or the like are arranged in the vicinity of the sealing edge 37 or of the sealing lip 60, as can be seen in FIG. 4 or 5.

The invention is not restricted to the exemplary embodiments described and represented. On the contrary, it also embraces all expert developments within the scope of the inventive idea. Thus, a switch of this kind can not only be employed in battery-operated appliances, but can also be used for electric appliances operated from the alternating-current mains. As is known per se, in instances of use of this kind, control electronics designed with phase control and having a triac as a power semiconductor are used.

LIST OR REFERENCE SYMBOLS:

1: Switch
2: Housing
3: Actuating member
4: Actuating tappet
5, 5': Arrow (for the movement of the actuating member)
6: Actuating lever
7: Connection
8: Connecting clip
9, 10: Contact bar
11, 12: Contact system
13: Contact system (changeover switch)
14: Connection
15: Extension (on the actuating tappet)
16, 17: Fixed contact
18, 19: Knife-edge bearing
20, 21: Switch contact
22, 23: Tension spring
24, 25: Cam
26: Control electronics
27: Circuit board
28: Power semiconductor
29: Connection (power semiconductor)
30: Cooling tab
31: Carrier part
32: Bearing plate
33: Wall perforation
34: Cooling body
35: Catch hook
36: Recess (cooling body)
37: Sealing edge
38: Groove (on the cooling body)
39: Housing wall
40: Depression
41: Extension
42: Hook element (changeover switch)
43: Slotted piece
44: Contact arm
45: Contact point 46: Contact bridge
47: Recovery diode
48: Orifice (in the cooling body)
49: Offset
50: Receptacle
51: Wiper
52: Resistance track
53: Compression spring
54: Contact track
55: Depression (in the cooling body)
56: Battery
57: Electric motor
58: Part of the carrier part (on the outside)
59: Orifice (in cooling tab)
60: Sealing lip
61: Nipple

We claim:

1. An electric switch for an electric hand tool, comprising
(a) a housing defined by housing walls; one of said housing walls having a throughgoing aperture;
(b) a contact assembly supported in said housing;
(c) a movable actuating member for switching said contact assembly;
(d) control electronics, including a power semiconductor, supported in said housing for controlling a motor of the electric hand tool;
(e) a cooling body disposed externally of said housing; said cooling body having a throughgoing orifice in alignment with said throughgoing aperture of said housing wall;
(f) a heat-conducting and electrically conducting carrier part supported in said housing and being electrically and heat-conductingly connected to said power semiconductor; said carrier part extending through said throughgoing aperture of said housing wall and said throughgoing orifice of said cooling body; said carrier part being oriented substantially perpendicularly to said cooling body and being in a heat-transferring contact therewith; and
(g) fastening means for holding said cooling body against said housing wall; said fastening means including cooperating parts formed on said carrier part and said cooling body for directly affixing said cooling body to said carrier part by at least one of frictional engagement and form-fitting engagement.

2. The electric switch as defined in claim 1, wherein said cooling body is a flat, plate-shaped component.

3. The electric switch as defined in claim 1, wherein said cooling body is of metal.

4. The electric switch as defined in claim 3, wherein said metal is one of aluminum and copper.

5. The electric switch as defined in claim 1, wherein said power semiconductor is disposed in said throughgoing aperture of said housing wall and said throughgoing aperture is covered by said cooling body.

6. The electric switch as defined in claim 1, further comprising a bearing plate supported in said housing and carrying a component of said contact assembly; said carrier part being integral with said bearing plate and extending at an angle therefrom.

7. The electric switch as defined in claim 1, further comprising a cooling tab being in contact with said power semiconductor and said carrier part.

8. The electric switch as defined in claim 1, wherein said one wall of said housing has an outer face provided with a depression; said depression surrounding said orifice and a portion of said carrier part projecting through said orifice.

9. The electric switch as defined in claim 8, wherein said carrier part has a conical tip projecting beyond said orifice and surrounded by said depression; further wherein said cooling body is held on said carrier part by frictional engagement between said carrier part and a wall portion of said cooling body defining said orifice through which said carrier part passes.

10. The electric switch as defined in claim 9, wherein a portion of said carrier part projecting beyond said orifice is offset in said depression with respect to said orifice.

11. The electric switch as defined in claim 9, wherein a portion of said carrier part projecting beyond said orifice is calked to said cooling body.

12. The electric switch as defined in claim 1, further comprising a sealing edge formed on said wall as an integral part thereof; said sealing edge fully surrounding said throughgoing aperture and projecting outwardly toward said cooling body and being in a sealing contact therewith.

13. The electric switch as defined in claim 12, wherein said sealing edge includes a sealing lip being in a sealing contact with said cooling body.

14. The electric switch as defined in claim 12, wherein said securing means holds said cooling body relative to said carrier part such that said cooling body is pressed against said sealing edge.

15. The electric switch as defined in claim 12, wherein said housing is of a thermoplastic material.

16. The electric switch as defined in claim 15, wherein said material is a glass fiber reinforced polyamide.

17. The electric switch as defined in claim 16, wherein said sealing edge has a thickness less than a thickness of said one wall of said housing.

18. The electric switch as defined in claim 12, wherein said sealing edge includes a resilient sealing lip projecting from said one wall of said housing towards said cooling body; said cooling body having a groove for receiving said sealing lip.

19. The electric switch as defined in claim 18, wherein said sealing lip projects from said one wall of said housing towards said cooling body at an angle of between 50°–90°.

20. The electric switch as defined in claim 1, further comprising connecting clips coupled to said contact assembly and situated externally of said housing; said contact clips being adapted to be coupled to terminals of a battery.

21. The electric switch as defined in claim 1, further comprising
(h) a changeover switch situated in said housing and coupled to said control electronics for selectively changing a direction of rotation of the tool motor;
(i) an actuating lever connected to said changeover switch for operating said changeover switch;
(j) a hook element formed on said actuating lever; and
(k) a slotted piece disposed in said housing and being engaged by said hook element for generating a pressure point and catch positions during changeover.

22. The electric switch as defined in claim 21, wherein hook element and said slotted piece are of a plastic material.

23. The electric switch as defined in claim 1, wherein said fastening means constitutes a sole fastening means for holding said cooling body against said housing wall.

24. An electric switch for an electric hand tool, comprising
(a) a housing defined by housing walls; one of said housing walls having a throughgoing aperture;

(b) a contact assembly supported in said housing;

(c) a movable actuating member for switching said contact assembly;

(d) control electronics, including a power semiconductor, supported in said housing for controlling a motor of the electric hand tool;

(e) a cooling body disposed externally of said housing;

(f) a heat-conducting and electrically conducting carrier part supported in said housing and being electrically and heat-conductingly connected to said power semiconductor; said carrier part extending through said throughgoing aperture of said housing wall to said cooling body and being in a heat-transferring contact therewith; and (g) cooperating snap-in means provided on said housing and said cooling body for affixing said cooling body to said housing.

25. The electric switch as defined in claim 24, wherein said snap-in means comprises (a) detent elements including one of catch hooks, nipples, bosses and studs formed on said housing; and (b) recesses provided in said cooling body for receiving said detent elements in a snap-in connection.

26. The electric switch as defined in claim 24, further comprising fastening means for holding said cooling body against said housing wall; said fastening means including cooperating parts formed on said carrier part and said cooling body for directly affixing said cooling body to said carrier part by at least one of a frictional engagement and a form-fitting engagement.

* * * * *